(12) United States Patent
Jung et al.

(10) Patent No.: US 11,039,536 B2
(45) Date of Patent: Jun. 15, 2021

(54) PRINTED CIRCUIT BOARD AND PRINTED CIRCUIT BOARD STRIP

(71) Applicant: LG INNOTEK CO., LTD., Seoul (KR)

(72) Inventors: Won Suk Jung, Seoul (KR); Sang Myung Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/043,369

(22) PCT Filed: Apr. 2, 2019

(86) PCT No.: PCT/KR2019/003832
§ 371 (c)(1),
(2) Date: Sep. 29, 2020

(87) PCT Pub. No.: WO2019/194517
PCT Pub. Date: Oct. 10, 2019

(65) Prior Publication Data
US 2021/0022250 A1  Jan. 21, 2021

(30) Foreign Application Priority Data

Apr. 4, 2018 (KR) .................. 10-2018-0039191

(51) Int. Cl.
*H05K 1/11* (2006.01)
*H05K 1/18* (2006.01)
(Continued)

(52) U.S. Cl.
CPC .......... *H05K 1/185* (2013.01); *H05K 1/0218* (2013.01); *H05K 1/115* (2013.01); *H05K 3/4697* (2013.01);
(Continued)

(58) Field of Classification Search
CPC .................... H05K 1/11–119; H05K 1/18–189
See application file for complete search history.

(56) References Cited

U.S. PATENT DOCUMENTS 8,779,599 B2  7/2014 Lin et al.
2013/0119552 A1  5/2013 Lin et al.
(Continued)

FOREIGN PATENT DOCUMENTS

KR   10-2007-0019359 A   2/2007
KR   10-2014-0112687 A   9/2014
(Continued)

OTHER PUBLICATIONS

International Search Report dated Jul. 9, 2019 in International Application No. PCT/KR2019/003832.

*Primary Examiner* — Jeremy C Norris
(74) *Attorney, Agent, or Firm* — Saliwanchik, Lloyd & Eisenschenk

(57) ABSTRACT

A printed circuit board according to an embodiment comprises: a first insulation layer; a plurality of first cavities formed in the central region of the first insulation layer; a plurality of second cavities formed in the outer region of the first insulation layer, excluding the central region; real dies respectively disposed in the plurality of first cavities; dummy dies respectively disposed in the plurality of second cavities; a second insulation layer formed on the first insulation layer and filling the first cavities and the second cavities; and a third insulation layer disposed beneath the first insulation layer, wherein the real dies comprise substantial driving elements and the dummy dies do not comprise the driving elements.

12 Claims, 8 Drawing Sheets

(51) Int. Cl.
*H05K 1/02* (2006.01)
*H05K 3/46* (2006.01)

(52) U.S. Cl.
CPC .............. *H05K 2201/09009* (2013.01); *H05K 2201/10204* (2013.01)

(56) References Cited

U.S. PATENT DOCUMENTS

| | | |
|---|---|---|
| 2015/0062850 A1 | 3/2015 | Choi et al. |
| 2016/0322330 A1 | 11/2016 | Lin et al. |
| 2017/0079143 A1 | 3/2017 | Ha et al. |

FOREIGN PATENT DOCUMENTS

| | | |
|---|---|---|
| KR | 10-2015-0028031 A | 3/2015 |
| KR | 10-2016-0129687 A | 11/2016 |
| KR | 10-2017-0033112 A | 3/2017 |

PRINTED CIRCUIT BOARD AND PRINTED CIRCUIT BOARD STRIP

CROSS-REFERENCE TO RELATED APPLICATIONS

This application is the U.S. national stage application of International Patent Application No. PCT/KR2019/003832, filed Apr. 2, 2019, which claims the benefit under 35 U.S.C. § 119 of Korean Patent Application No. 10-2018-0039191, filed Apr. 4, 2018, the disclosures of each of which are incorporated herein by reference in their entirety.

TECHNICAL FIELD

Embodiments relate to a printed circuit board and, more particularly, to a component-embedded printed circuit board and a printed circuit board strip including the same.

BACKGROUND ART

With miniaturization of electronic apparatuses, electronic components include more functions or the sizes thereof may decrease.

In particular, in order to reduce the thickness of a portable terminal such as a mobile phone or a portable computer, the thicknesses of components mounted therein need to be significantly reduced. In order to miniaturize the components, there is an increasing demand to reduce the thickness of a component package and there is an increasing demand to implement high functions by mounting a plurality of integrated circuit chips for multiple functions in one component package. To this end, component package technology such as a chip-embedded printed circuit board in which a chip is embedded between upper and lower printed circuit boards has been developed. In chip-embedded printed circuit board technology, it is possible to miniaturize all package components by embedding a chip between boards and to expect the effect of improving high-frequency characteristics through an increase in the mounting density of the components, thereby improving electrical characteristics.

A printed circuit board (PCB) having electronic components embedded therein is manufactured by forming a cavity in which electronic components will be disposed in a central insulating layer, inserting electronic components into the formed cavity, and pressing an additional insulating layer in a state in which the electronic components are inserted.

Meanwhile, in the conventional printed circuit board, the cavity is formed only in a region in which a real die including a substantial device is disposed. At this time, the central insulating layer may be divided into a region, in which the cavity is formed, and the other region. In addition, an upper insulating layer is disposed on the central insulating layer while filling the cavity. In addition, a lower insulating layer may be disposed under the central insulating layer.

At this time, in order to equally adjust the thickness of the upper insulating layer and the thickness of the lower insulating layer, the amount of resin filled in the cavity needs to be considered. Therefore, in the related art, an insulating material configuring the upper insulating layer is thicker than an insulating material configuring the lower insulating layer.

However, when the thickness of the upper insulating layer and the thickness of the lower insulating layer are equally adjusted by adjusting the thicknesses of the insulating materials, a difference between the thicknesses of the region, in which the cavity is formed, and the other region in the upper insulating layer occurs, thereby causing a warping phenomenon of the printed circuit board.

In addition, recently, in order to improve productivity in a process upon manufacturing a board package, a strip structure in which the units of a plurality of printed circuit boards are unified is manufactured, which is generally referred to as a printed circuit board strip.

At this time, in the printed circuit board strip, the printed circuit board units are disposed in a central region and alignment holes for automating a strip inspection process or an assembly process are formed in an outer region.

However, when the printed circuit board strip is manufactured, a real die configuring the printed circuit board unit is disposed in the central region, but a die is not disposed in the outer region. At this time, as described above, a difference between the thicknesses of the insulating layers occurs in the outer region. Accordingly, in the related art, a strip wrapping phenomenon in the outer region severely occurs. Therefore, it is difficult to automate the strip inspection process and the assembly process.

INVENTION

Technical Problem

Embodiments provide a printed circuit board including a dummy die, which is capable of minimizing a wrapping phenomenon of the component-embedded printed circuit board.

Embodiments provide a printed circuit board strip which is capable of minimizing a wrapping phenomenon occurring in an outer region, by inserting a dummy die in the outer region of the printed circuit board strip.

The technical problems solved by the embodiments are not limited to the above technical problems and other technical problems which are not described herein will become apparent to those skilled in the art from the following description.

Technical Solution

According to an aspect for achieving the above-described objects, a printed circuit board includes a first insulating layer, a plurality of first cavities formed in a central region of the first insulating layer, a plurality of second cavities formed in an outer region of the first insulating layer excluding the central region, a real die disposed in each of the plurality of first cavities, a dummy die disposed in each of the plurality of second cavities, a second insulating layer disposed on the first insulating layer, and a third insulating layer disposed under the first insulating layer. The real die includes a driving device, and the dummy die does not include the driving device.

In addition, an entire area of the plurality of second cavities may occupy at least 30% of an entire area of the outer region of the first insulating layer.

The dummy die may be formed of any one of a semiconductor material, a ceramic material, a metal material or an organic/inorganic composite material.

A height of the dummy die may be equal to that of the real die.

A height of the dummy die may be equal to that of the first insulating layer.

An upper surface of the dummy die may be directly in contact with a lower surface of the second insulating layer, and a lower surface of the dummy die may be directly in contact with an upper surface of the third insulating layer.

The printed circuit board may further include a first circuit pattern disposed on the dummy die, a second circuit pattern disposed under the dummy die, and a via formed to penetrate through the dummy die.

The second cavities may include (2-1)-th cavities disposed in a long-axis direction of the first insulating layer; and (2-2)-th cavities disposed in a short-axis direction of the first insulating layer, and a gap between the (2-1)-th cavities may be equal to a gap between the plurality of first cavities.

The gap between the (2-1)-th cavities may be less than a gap between the (2-2)-th cavities.

A printed circuit board strip includes a frame region located in a central region of the printed circuit board strip and including disposed therein a plurality of printed circuit board units in which at least one real die is embedded, and a dummy region located in an outer region of the printed circuit board strip and including a dummy region in which a plurality of dummy dies is embedded. The real die includes a driving device, and the dummy die does not include the driving device.

In addition, a plurality of cavities, into which the dummy die is inserted, is formed in the dummy region, and an entire area of the plurality of cavities occupies 30% or more of an entire area of the dummy region.

The dummy region may be a ground region.

Effect of the Invention

In the embodiment, when a component-embedded printed circuit board is manufactured, in an insulating layer in which a component is embedded, a cavity is formed even in a region in which the component is not included and a dummy die is inserted into the formed cavity. At this time, the dummy die does not include a real chip. That is, the dummy die may be formed of any one of a semiconductor material such as Si or GAAS, a ceramic material such as glass, a metal material such as copper or aluminum or an organic/inorganic composite material. In addition, the cavity occupies 30% or more of the region other than the region, in which the component is mounted, of the entire region of the insulating layer. According to the embodiment, in the component-embedded printed circuit board, it is possible to minimize a difference between the thicknesses of the upper insulating layer and the lower insulating layer based on the central insulating layer. In addition, according to the embodiment, it is possible to minimize a warping phenomenon occurring in the outer portion of the board by the dummy die having certain rigidity.

In addition, in the embodiments, the above-described dummy is applicable to a printed circuit board strip. That is, a plurality of printed circuit board units having components embedded therein is disposed in the central region of the printed circuit board strip. In addition, the dummy die is inserted into the outer region corresponding to the ground region of the printed circuit board strip, along with the cavity. Therefore, it is possible to minimize a warping phenomenon occurring in the outer region of the printed circuit board strip and to improve reliability.

BEST MODE

Figure 1:
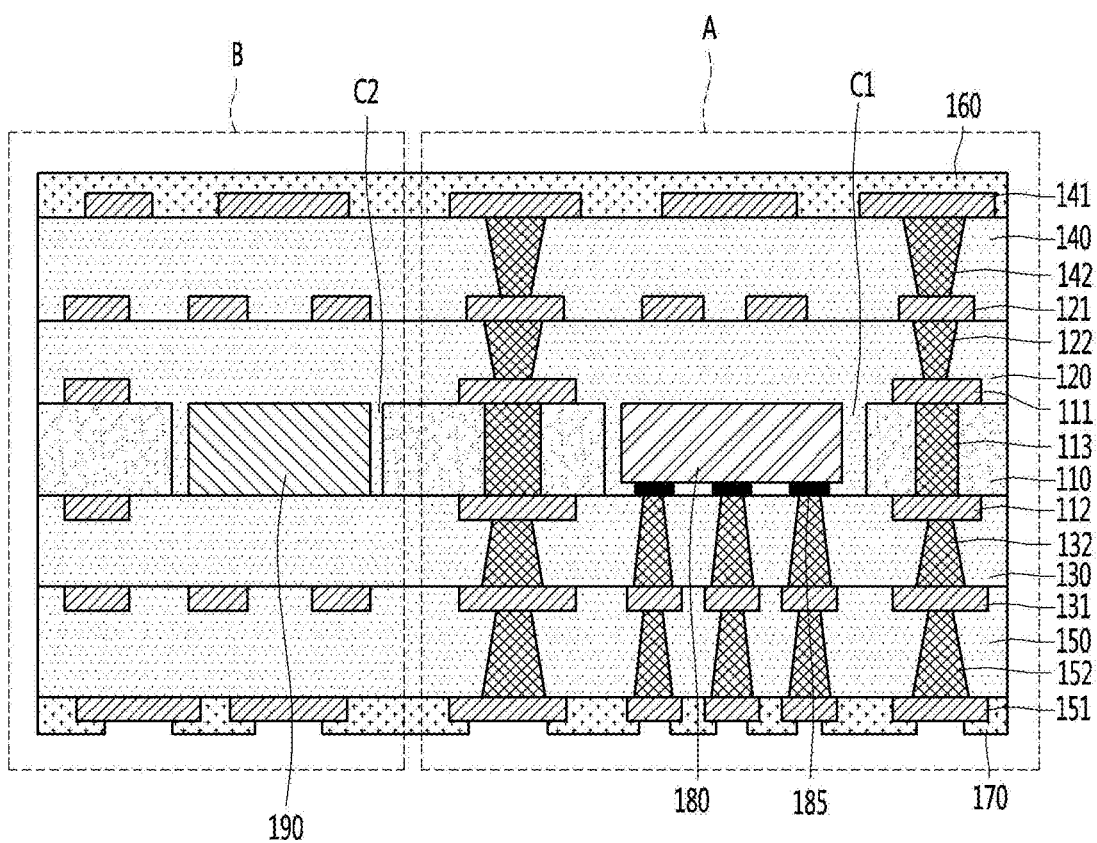
FIG. 1 is a cross-sectional view showing the structure of a printed circuit board according to an embodiment.

Hereinafter, the configuration and operation of the embodiments will be described in detail with reference to the accompanying drawings. For the sake of brief description with reference to the drawings, the same or equivalent components may be provided with the same reference numbers, and description thereof will not be repeated. Terms such as first and second may be used to describe various components, but the components should not be limited by the terms. These terms are used only for the purpose of distinguishing one component from another component.

Hereinafter, embodiments will be clearly revealed through the accompanying drawings and descriptions of the embodiments. In description of the embodiments, it will be understood that, when an element such as a layer (film), region, pattern or structure is referred to as being formed "on" or "under" another element, such as a substrate, layer (film), region, pad or pattern, it can be directly "on" or "under" the other element or be indirectly formed with intervening elements therebetween. In the drawings, the thickness or size of each layer may be exaggerated, omitted or schematically shown for convenience and clarity of description, and the size of each component is not always an actual size. Hereinafter, embodiments will be described with reference to the accompanying drawings.

Figure 2:
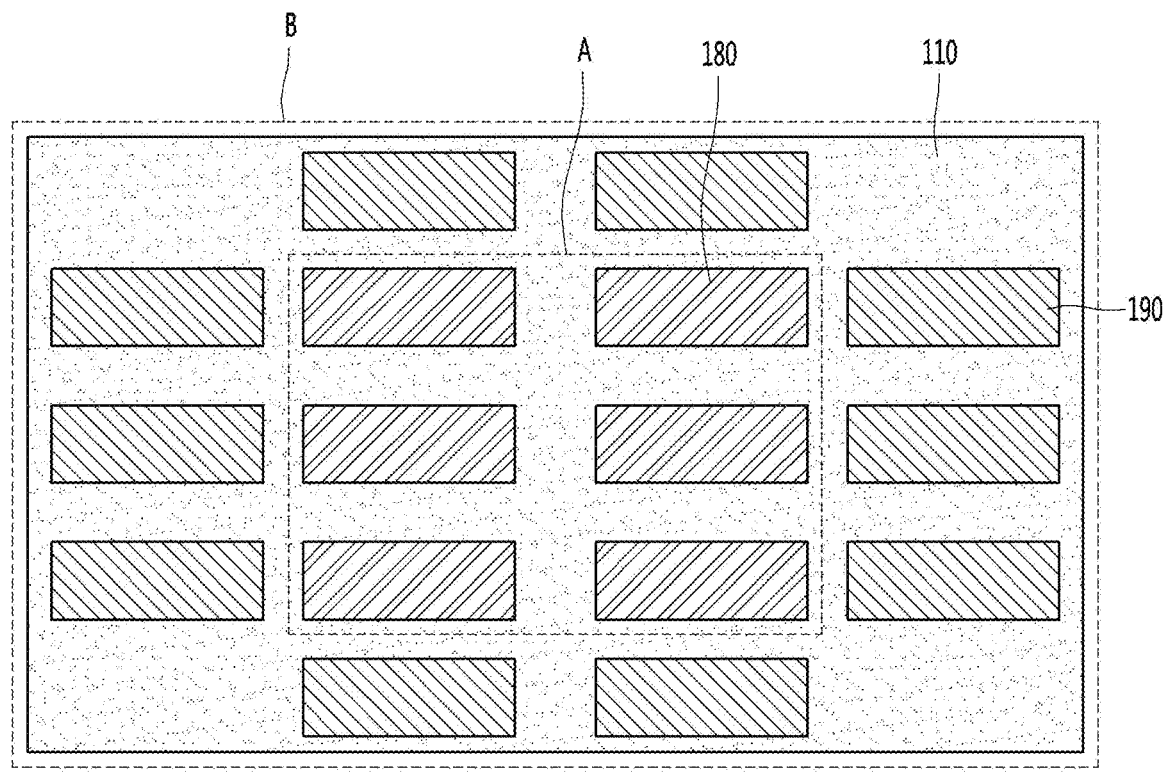
FIG. 2 is a plan view of a first insulating layer of FIG. 1.

FIG. 1 is a cross-sectional view showing the structure of a printed circuit board according to an embodiment. FIG. 2 is a plan view of a first insulating layer of FIG. 1. FIGS. 3 to 10 are cross-sectional views showing a method of manufacturing the printed circuit board shown in FIG. 1.

Referring to FIG. 1, the printed circuit board 100 includes a first insulating layer 110, a first cavity C1 and a second cavity C2 formed in the first insulating layer 100, a first circuit pattern 111 disposed on an upper surface of the first insulating layer 110, a second circuit pattern 112 disposed on a lower surface of the first insulating layer 110, a first via 113 formed to penetrate through the first insulating layer 110, a second insulating layer 120 disposed on the first insulating layer 110, a third circuit pattern 121 disposed on the second insulating layer 120, a second via 122 disposed to penetrate through the second insulating layer 120, a third insulating layer 130 disposed under the first insulating layer 110, a fourth circuit pattern 131 disposed under the third insulating layer 130, a third via 132 formed to penetrate through the third insulating layer 130, a fourth insulating layer 140 disposed on the second insulating layer 120, a fifth circuit pattern 141 disposed on the fourth insulating layer 140, a fourth via 142 formed to penetrate through the fourth insulating layer 140, a fifth insulating layer 150 disposed under the third insulating layer 130, a sixth circuit pattern 151 disposed under the fifth insulating layer 150, a fifth via 152 formed to penetrate through the fifth insulating layer 150, a first protective layer 160 disposed on the fourth insulating layer 140, a second protective layer 170 disposed under the fifth insulating layer 150, a real die 180 inserted into the first cavity C1, and a dummy die 190 inserted into the second cavity C2.

In the printed circuit board 100, the circuit pattern of electrical wiring connecting electronic components may be represented by a wiring figure based on the circuit design, and an electrical conductor may be formed on an insulating material. In addition, the printed circuit board 100 may have electronic components (which may be the real die) embedded therein, a circuit pattern electrically connecting the electronic components may be formed, and components other than the electronic components having electrical connection functions may be mechanically fixed.

The first insulating layer 110 may be the supporting substrate of the printed circuit board 100 on which a single circuit pattern is formed, and may mean an insulating region, in which any one circuit pattern is formed, of the printed circuit board 100 having a plurality of stack structures.

Preferably, the printed circuit board 100 has a six-layer structure (6 metal layers), and thus the printed circuit board 100 includes five insulating layers.

The first insulating layer 110 may be a central insulating layer of the printed circuit board 100 and may be a core insulating layer.

A plurality of cavities is formed in the first insulating layer 110. At this time, at least one of the plurality of cavities may be the first cavity C1, into which the real die 180 is inserted, and at least another of the plurality of cavities may be the second cavity C2, into which the dummy die 190 is inserted.

The first circuit pattern 111 and the second circuit pattern 112 are disposed on the surface of the first insulating layer 110.

In addition, the first via 113 electrically connecting the first circuit pattern 111 and the second circuit pattern 112 may be formed in the first insulating layer 110.

The first circuit pattern 111 and the second circuit pattern 112 may be formed of at least one metal material selected from gold (Au), silver (Ag), Platinum (Pt), titanium (Ti), tin (Sn), copper (Cu) and zinc (Zn). In addition, the first circuit pattern 111 and the second circuit pattern 112 may be formed of a paste or a solder paste including gold (Au), silver (Ag), Platinum (Pt), titanium (Ti), tin (Sn), copper (Cu) and zinc (Zn).

Meanwhile, the first circuit pattern 111 and the second circuit pattern 112 may be formed using an additive process, a subtractive process, a modified semi additive process (MSAP) and semi additive process (SAP), which are general methods of manufacturing a printed circuit board. A detailed description thereof will be omitted herein.

In addition, the first via 113 may be formed by filling the inside of a through-hole (not shown) penetrating through the first insulating layer 110 with a conductive material.

The through-hole may be formed by any one of a mechanical, laser or chemical process.

When the through-hole is formed by the mechanical process, a milling, drilling or routing method may be used. When the through-hole is formed by the laser process, a UV or $CO_2$ laser method may be used. When the through-hole is formed by the chemical process, the first insulating layer 110 may be opened using chemical including aminosilane, ketone, etc.

Meanwhile, the laser process is a cutting method of forming a desired shape by concentrating optical energy on a surface to dissolve and evaporate a portion of a material. By this process, it is possible to easily form a complicated shape by a computer program and to process a complex material which is difficult to be cut using other methods.

In addition, the laser process has a minimum cutting diameter of up to 0.005 mm and has a wide thickness range.

As the laser processing drill, a Yttrium Aluminum Garnet (YAG) laser, a $CO_2$ laser, or an ultraviolet (UV) is preferably used. The YAG laser may process both a copper foil layer and an insulating layer and the $CO_2$ laser may process only the insulating layer.

When the through-hole is formed, the inside of the through-hole is filled with a conductive material, thereby forming the first via 113. The conductive material forming the first via 113 may be any one selected from copper (Cu), silver (Ag), tin (Sn), gold (Au), nickel (Ni) and palladium (Pd), and the filling of the conductive material may be performed using any one of electroless plating, electroplating, screen printing, sputtering, evaporation, ink jetting and dispensing or a combination thereof.

The second insulating layer 120 is disposed on the first insulating layer 110. The second insulating layer 120 may be disposed on the first insulating layer 110 while filling portions of the first cavity C1 and the second cavity C2 formed in the first insulating layer 110. The second insulating layer 120 may be a thermosetting or thermoplastic polymer substrate, a ceramic substrate, an organic/inorganic composite substrate, or a glass fiber impregnated substrate, and may include epoxy-based insulating resin when polymer resin is included or include polyimide-based resin.

In addition, the third insulating layer 130 is disposed under the first insulating layer 110.

The second insulating layer 120 and the third insulating layer 130 may substantially have the same thickness. At this time, since the second insulating layer 120 fills the first cavity C1 and the second cavity C2, a larger amount of resin than the amount of resin configuring the third insulating layer 130 may be formed.

The third circuit pattern 121 is disposed on the second insulating layer 120. In addition, in the second insulating layer 120, the second via 122 penetrating through the second insulating layer 120 is formed.

The second via 122 may electrically connect the first circuit pattern 111 and the third circuit pattern 121.

The fourth circuit pattern 131 is disposed under the third insulating layer 130. In addition, in the third insulating layer 130, the third via 132 penetrating through the third insulating layer 130 is formed. The third via 132 may electrically connect the second circuit pattern 112 and the fourth circuit pattern 131.

The fourth insulating layer 140 may be disposed on the second insulating layer 120. In addition, the fifth circuit pattern 141 may be disposed on the fourth insulating layer 140. In addition, in the fourth insulating layer 140, the fourth via 142 penetrating through the fourth insulating layer 140 is formed.

The fourth via 142 may electrically connect the third circuit pattern 121 and the fifth circuit pattern 141.

The fifth insulating layer 150 is disposed under the third insulating layer 130. In addition, the sixth circuit pattern 151 is disposed under the fifth insulating layer 150. In addition, in the fifth insulating layer 150, the fifth via 152 penetrating through the fifth insulating layer 150 may be formed. The fifth via 122 may electrically connect the fourth circuit pattern 131 and the sixth circuit pattern 151.

Meanwhile, the first protective layer 160 is disposed on the fourth insulating layer 140. The first protective layer 160 may be disposed to cover the surface of the fifth circuit pattern 141 formed on the fourth insulating layer 140. The first protective layer 160 may include one or more layers using one or more of solder resist (SR), oxide and Au.

The second protective layer 170 is disposed under the fifth insulating layer 150. At this time, the second protective layer 170 may include an opening (not shown) for exposing the surface of the sixth circuit pattern 151 disposed under the fifth insulating layer 150. The second protective layer 170 may include one or more layers using one or more of solder resist (SR), oxide and Au.

Meanwhile, in the first insulating layer 110, as described above, the first cavity C1 and the second cavity C2 are formed.

The real die 180 including a substantial driving device is inserted into the first cavity C1. Therefore, the first cavity C1 may be formed in a region in which the real die 180 will be disposed. That is, the first cavity C1 may be formed in a region in which the driving device is mounted.

In the first cavity C1, the real die 180 is mounted. The real die 180 may include any one of electronic components such as various devices. In addition, the devices may include any one of an active device and a passive device.

The active device refers to a device which actively uses a non-linear part and the passive device refers to a device which does not use non-linear characteristics even though both linear and non-linear characteristics exist. In addition, the passive device may include a transistor, an IC semiconductor chip, etc., and the passive device may include a capacitor, a resistor, an inductor, etc. The passive element is mounted on a board together with a general semiconductor package in order to increase a signal processing speed of a semiconductor chip, which is an active element, or to perform a filtering function.

Preferably, the electronic component may include an active device (not shown) including a terminal 185 on one surface thereof and a passive device in which a terminal is formed in a structure surrounding the side surfaces of the body of the device.

At this time, referring to FIG. 2, the first cavity C1 may be formed in a central region A of the upper surface of the first insulating layer 110. That is, when the first cavity C1 is disposed in the outer region B of the first insulating layer 110, the real die 180 may be damaged by external impact and thus the first cavity C1 may be disposed in the central region A excluding the outer region B.

Meanwhile, the second cavity C2 may be selectively disposed in the outer region B excluding the central region A.

The second cavity C2 may be formed in a region, into which the dummy die 190 will be inserted. The dummy die 190 does not include the substantial driving device unlike the real die 180.

The second cavity C2 may be formed to solve the thickness difference of the second insulating layer 120 occurring as the second insulating layer 120 fills the portion of the first cavity C1, according to formation of the first cavity C1. That is, the central region of the second insulating layer 120 fills the first cavity C1, and outer region is formed only on the surface of the first insulating layer 110. Therefore, the difference between the thickness of the second insulating layer 120 in the central region vertically overlapping the first cavity C1 and the thickness of the second insulating layer in the outer region occurs.

Therefore, in the embodiment, as described above, the second cavity C2 is formed in the outer region of the first insulating layer 110. According to formation of the second cavity C2, the outer region of the second insulating layer 120 fills a portion of the second cavity C2 similarly to the central region, thereby solving the difference between the thickness of the central region and the thickness of the outer region.

In addition, the dummy die 190 may be inserted into the second cavity C2, thereby ensuring rigidity of the outer region of the printed circuit board 100. In addition, the dummy die may inhibit external impact from being transmitted to the real die 180.

The dummy die 190 may be formed of a semiconductor material such as Si or GAAS, a ceramic material such as glass, a metal material such as copper or aluminum or an organic/inorganic composite material. In addition, the second cavity C2 is formed to occupy 30% or more of the area of the outer region excluding the central region, in which the real die 180 is mounted, of the entire area of the first insulating layer 110.

At this time, when the area of the second cavity C2 is less than 30% of the entire area of the outer region, it may be impossible to completely solve the difference between the thicknesses of the outer region and the central region of the second insulating layer 120. Therefore, a warping phenomenon occurs in the outer region.

Meanwhile, the second cavity C2 does not exceed 70% of the entire area of the outer region. That is, when the second cavity C2 exceeds 70% of the entire area of the outer region, in the process of manufacturing the printed circuit board according to formation of the second cavity C2, it is impossible to ensure rigidity of the first insulating layer 110. Therefore, reliability of the process of manufacturing the printed circuit board may be lowered.

Meanwhile, the first cavity C1 may have the same size as the second cavity C2.

Preferably, the second cavity C2 may have a width of 2.95 mm in a first direction, and have a width of 2.54 mm in a second direction. In addition, the dummy die 190 may have a width of 2.82 mm in the first direction, and have a width of 2.41 mm in the second direction.

Meanwhile, the second cavity C2 may be selectively disposed in the outer region other than the corner region of the upper surface of the first insulating layer 110.

In the embodiment, when a component-embedded printed circuit board is manufactured, in an insulating layer in which a component is embedded, a cavity is formed even in a region in which the component is not included and a dummy die is inserted into the formed cavity. At this time, the dummy die does not include a real chip. That is, the dummy die may be formed of any one of a semiconductor material such as Si or GAAS, a ceramic material such as glass, a metal material such as copper or aluminum or an organic/inorganic composite material. In addition, the cavity is formed to occupy 30% or more of the area of the outer region excluding a region, in which the component is mounted, of the entire area of the insulating layer. According to the embodiment, in the component-embedded printed circuit board, it is possible to minimize the difference between the thicknesses of an upper insulating layer and a lower insulating layer based on a central insulating layer. In addition, according to the embodiment, it is possible to minimize a warping phenomenon occurring in the outer portion of the board by the dummy die having certain rigidity.

Hereinafter, the method of manufacturing the printed circuit board shown in FIG. 1 will be described in detail with reference to FIGS. 3 to 10.

Figure 3:
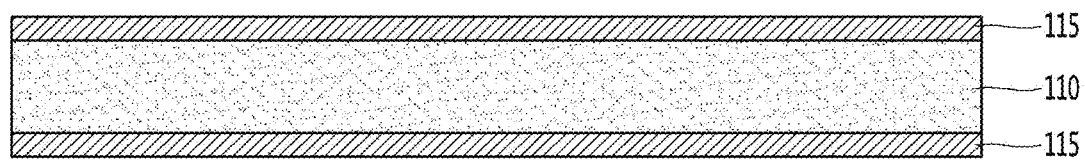
FIGS. 3 to 10 are cross-sectional views sequentially showing a method of manufacturing the printed circuit board shown in FIG. 1.

First, referring to FIG. 3, a base material which is used to manufacture the printed circuit board is prepared. The base material may include the first insulating layer 110 and first metal layers 115 disposed on upper and lower surface of the first insulating layer 110.

The first insulating layer 110 may be a thermosetting or thermoplastic polymer substrate, a ceramic substrate, an organic/inorganic composite substrate, or a glass fiber impregnated substrate, and may include epoxy-based insulating resin when polymer resin is included or include polyimide-based reason.

That is, the first insulating layer 110 is a board on which an electrical circuit capable of changing wiring is arranged, and may include a printed or wiring board and an insulating board made of an insulating material and having a conductor pattern capable of being formed on a surface thereof.

The first insulating layer 110 may be rigid or flexible. For example, the insulating layer 110 may include glass or plastic. Specifically, the insulating layer 110 includes chemically tempered/semi-tempered glass such as soda lime glass or aluminosilicate glass, reinforced or soft plastic such as polyimide (PI), polyethylene terephthalate (PET), propylene glycol (PPG) or polycarbonate (PC), or sapphire.

In addition, the first insulating layer 110 may include an optically isotropic film. For example, the insulating layer 110 may include cyclic olefin copolymer (COC), cyclic olefin polymer (COP), optically isotropic polycarbonate (PC), or optically isotropic polymethylmethacrylate (PMMA).

In addition, the first insulating layer 110 may be bent while having a partially curved surface. That is, the first insulating layer 110 may be bent while having a partially flat surface and a partially curved surface. Specifically, an end of the first insulating layer 110 may be bent while having a curved surface and may be bent or curved while having a surface including a random curvature.

In addition, the first insulating layer 110 may be a flexible board having flexible characteristics.

In addition, the first insulating layer 110 may be a curved or bent board. At this time, in the first insulating layer 110, electrical wiring connecting circuit components are represented by a wiring figure based on circuit design and an electrical conductor may be formed on an insulating material. In addition, electrical components may be mounted, wiring for connecting the electrical components may be formed, and components other than the components having electrical connection functions may be mechanically fixed.

The first metal layer 115 may not be formed on the surface of the first insulating layer 110 by electroless plating but may be formed using general copper clad laminate (CCL).

At this time, when the first metal layer 115 is formed by electroless plating, plating may be smoothly performed by providing illumination to the upper surface of the first insulating layer 110.

The electroless plating method can be performed in the following order: a degreasing process, a soft corrosion process, a pre-catalyst treatment process, a catalyst treatment process, an activation process, an electroless plating process and an oxidation prevention process. In addition, the first metal layer 115 may be formed by sputtering metal particles using plasma instead of plating.

At this time, before plating the first metal layer 115, a desmear process of removing smear from the surface of the first insulating layer 110 may be further performed. The desmear process is performed to increase plating power for forming the first metal layer 115 by providing illumination to the surface of the first insulating layer 110.

Figure 4:
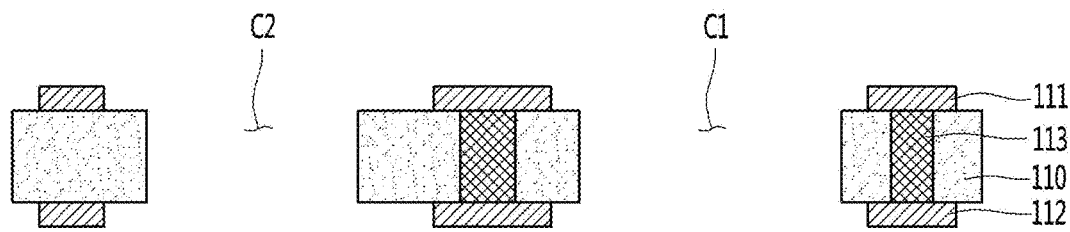

Next, referring to FIG. 4, in the first insulating layer 110, the first cavity C1 and the second cavity C2 are formed. The first cavity C1 may be disposed in the central region of the first insulating layer 110, and the second cavity C2 may be disposed in the outer region of the first insulating layer 110 while surrounding the first cavity C1.

In addition, the first circuit pattern 111 and the second circuit pattern 112 are formed by removing the first metal layer 115 formed on each of the upper and lower surfaces of the first insulating layer 110.

At this time, before forming the first circuit pattern 111 and the second circuit pattern 112, a through-hole penetrating through the first insulating layer 110 may be formed and filled with a metal material, thereby forming the first via 113.

Figure 5:
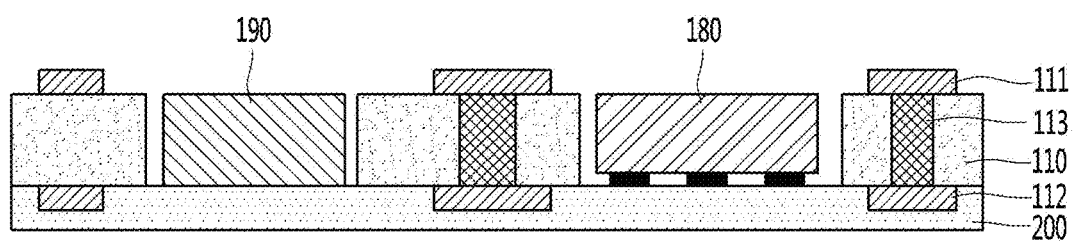

Next, referring to FIG. 5, an adhesive member 200 is attached to the lower surface of the first insulating layer 110, thereby blocking the lower portions of the first cavity C1 and the second cavity C2 formed in the first insulating layer 110. In addition, the real die 180 is attached to the first cavity C1 blocked by the adhesive member 200 and the dummy die 190 is formed on the second cavity C2.

That is, the second cavity C2 is formed in the outer region of the first insulating layer 110. According to formation of the second cavity C2, a portion of the second cavity C2 is filled in the outer region of the second insulating layer 120 similarly to the central region, thereby solving the difference between the thickness of the central region and the thickness of the outer region.

In addition, the dummy die 190 is inserted into the second cavity C2, thereby ensuring rigidity in the outer region of the printed circuit board 100. In addition, the dummy die may inhibit external impact from being transmitted to the real die 180.

The dummy die 190 may be formed of a semiconductor material such as Si or GAAS, a ceramic material such as glass, a metal material such as copper or aluminum or an organic/inorganic composite material. In addition, the second cavity C2 is formed to occupy 30% or more of the area of the outer region excluding the central region, in which the real die 180 is mounted, of the entire area of the first insulating layer 110.

At this time, when the area of the second cavity C2 is less than 30% of the entire area of the outer region, it may be impossible to completely solve the difference between the thicknesses of the outer region and the central region of the second insulating layer 120. Therefore, a warping phenomenon occurs in the outer region.

Meanwhile, the second cavity C2 does not exceed 70% of the entire area of the outer region. That is, when the second cavity C2 exceeds 70% of the entire area of the outer region, in the process of manufacturing the printed circuit board according to formation of the second cavity C2, it is impossible to ensure rigidity of the first insulating layer 110. Therefore, reliability of the process of manufacturing the printed circuit board may be lowered.

Meanwhile, the first cavity C1 may have the same size as the second cavity C2.

Preferably, the second cavity C2 may have a width of 2.95 mm in a first direction, and have a width of 2.54 mm in a second direction. In addition, the dummy die 190 may have a width of 2.82 mm in the first direction, and have a width of 2.41 mm in the second direction.

Meanwhile, the second cavity C2 may be selectively disposed in the outer region other than the corner region of the upper surface of the first insulating layer 110.

Figure 6:
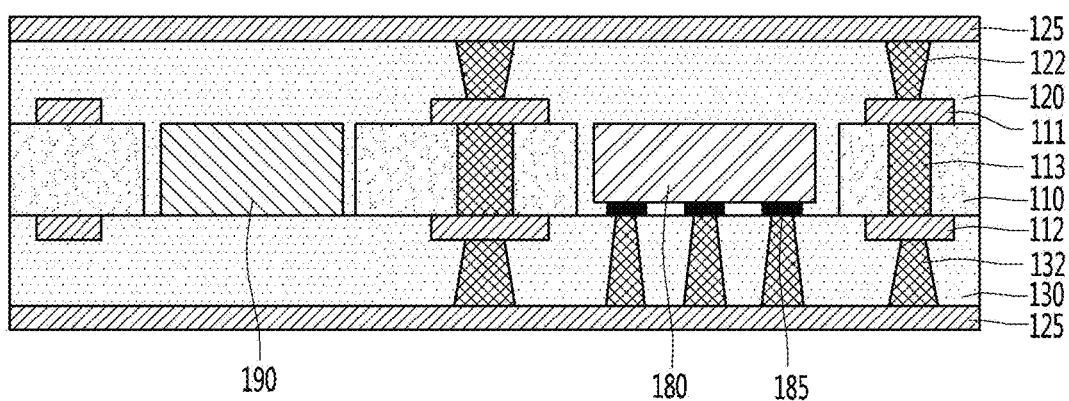

Next, referring to FIG. 6, when the real die 180 and the dummy die 190 are inserted, the adhesive member 200 disposed under the first insulating layer 110 is removed.

In addition, the second insulating layer 120 filling the first cavity C1 and the second cavity C2 is disposed on the first insulating layer 110. At this time, the second metal layer 125 may be disposed on the second insulating layer 120.

In addition, the third insulating layer 130 is formed under the first insulating layer 110. At this time, the third insulating layer 125 may be disposed under the third insulating layer 130.

Figure 7:
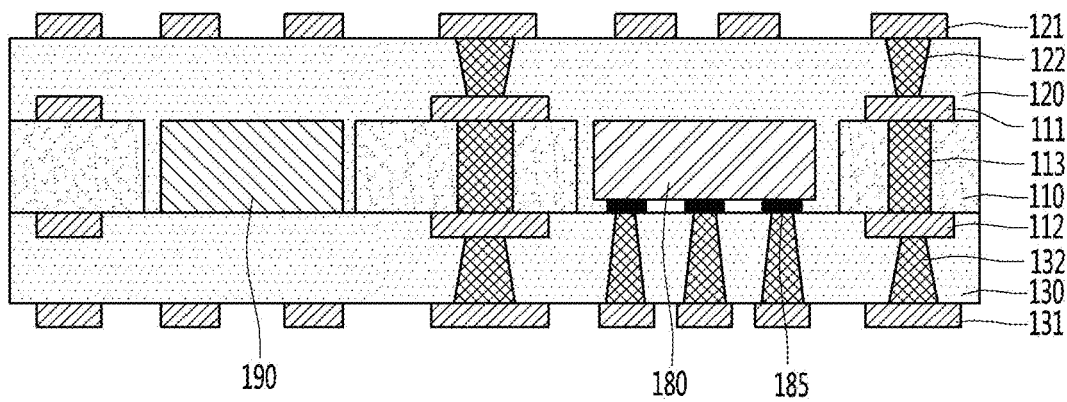

Thereafter, referring to FIG. 7, the third circuit pattern 121 is formed through removal of the second metal layer 125 and the second via 122 penetrating through the second insulating layer 120. In addition, in the third insulating layer 130, the fourth circuit pattern 131 is formed through removal of the third metal layer 135 and the third via 132 penetrating through the third insulating layer 130.

Figure 8:
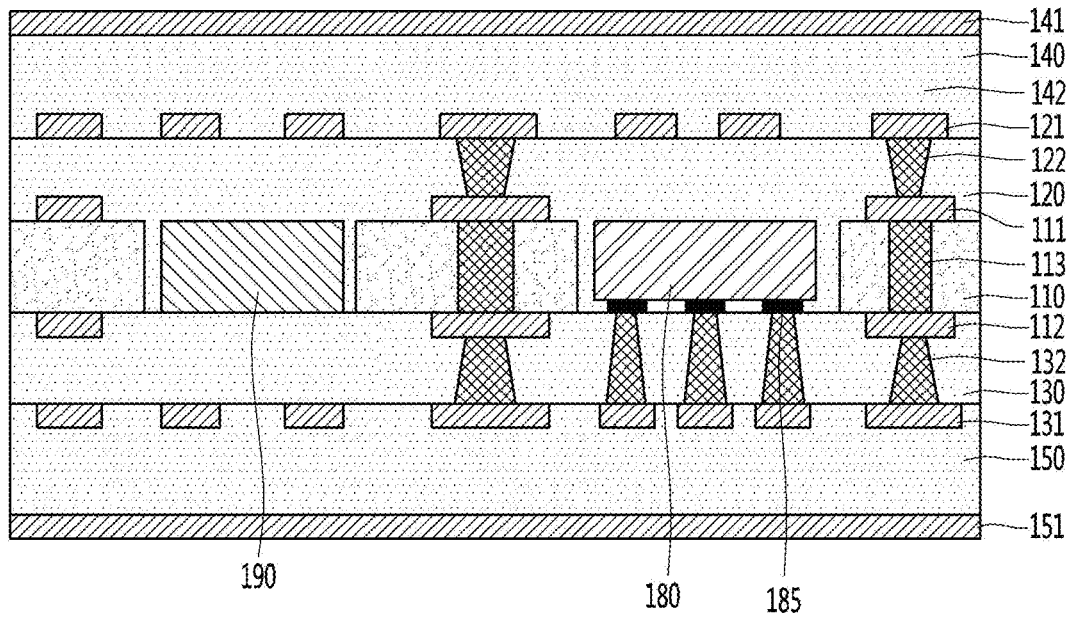

Next, referring to FIG. 8, the fourth insulating layer 140 is disposed on the second insulating layer 120. At this time, the fourth metal layer 145 may be disposed on the fourth insulating layer 140.

In addition, the fifth insulating layer 150 is formed under the second insulating layer 120. At this time, the fifth metal layer 155 may be disposed under the fifth insulating layer 150.

Figure 9:
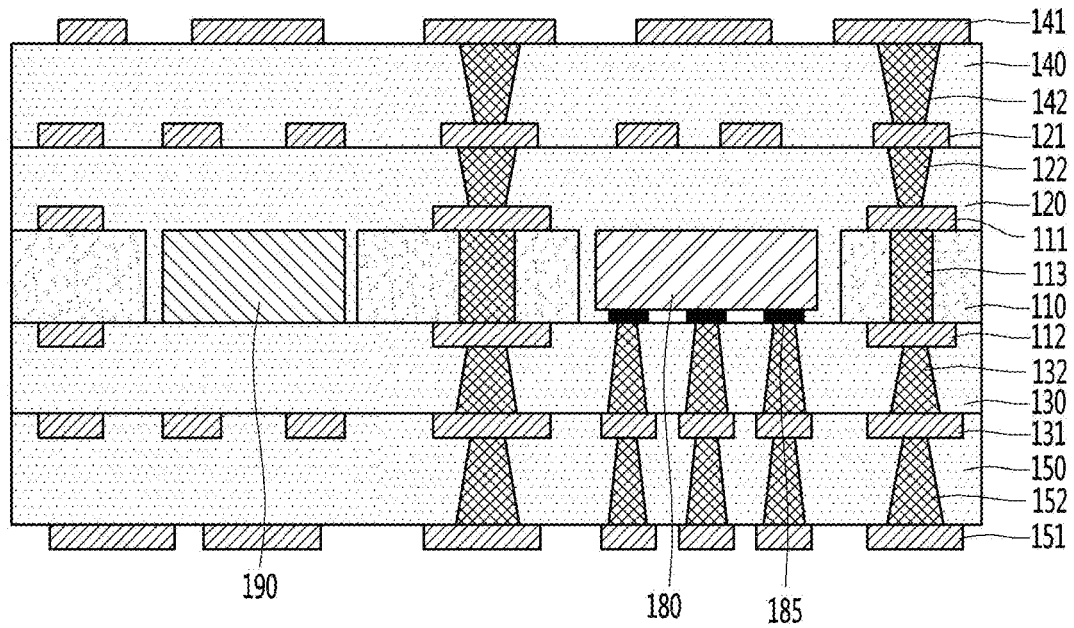

Thereafter, referring to FIG. 9, the fifth circuit pattern 141 is formed through removal of the fourth metal layer 145 and the fourth via 142 penetrating through the fourth insulating layer 140. In addition, in the fifth insulating layer 150, the sixth circuit pattern 151 is formed through removal of the fifth metal layer 155 and the fifth via 152 penetrating through the fifth insulating layer 150.

Figure 10:
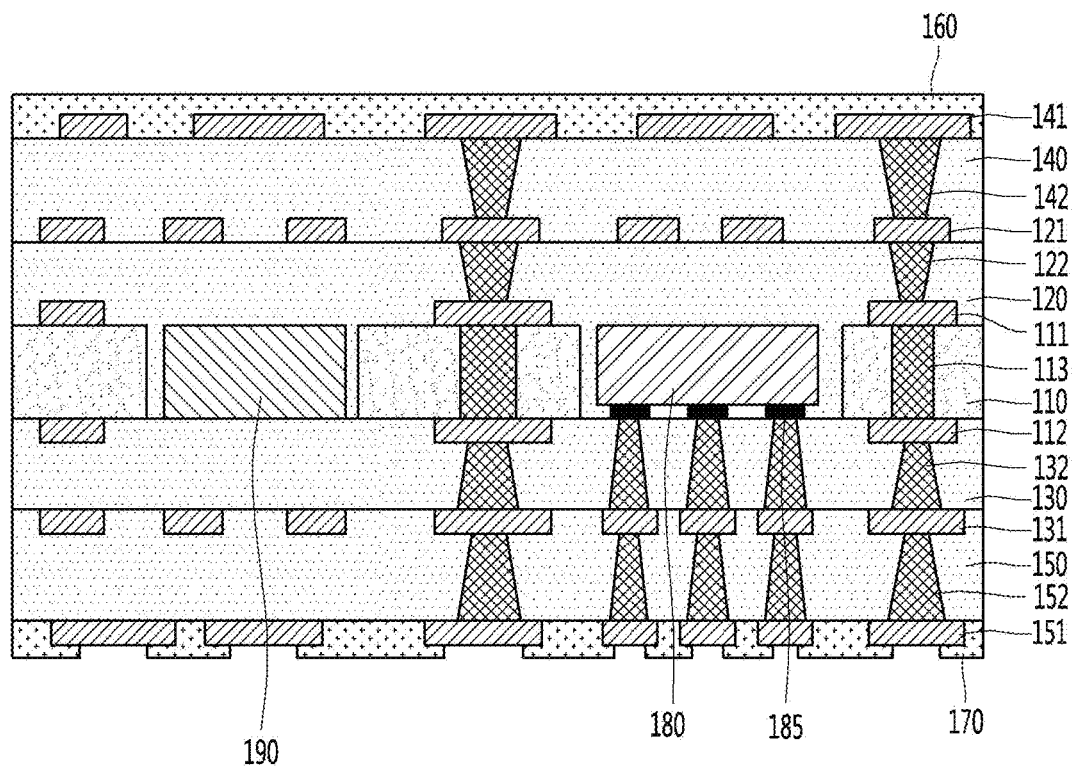

Next, referring to FIG. 10, the first protective layer 160 covering the fifth circuit pattern is formed on the fourth insulating layer 140. In addition, the second protective layer 170 covering the sixth circuit pattern 151 is formed under the fifth insulating layer 150. At this time, the second protective layer 170 may have an opening for exposing at least a portion of the surface of the sixth circuit pattern 151.

Figure 11:
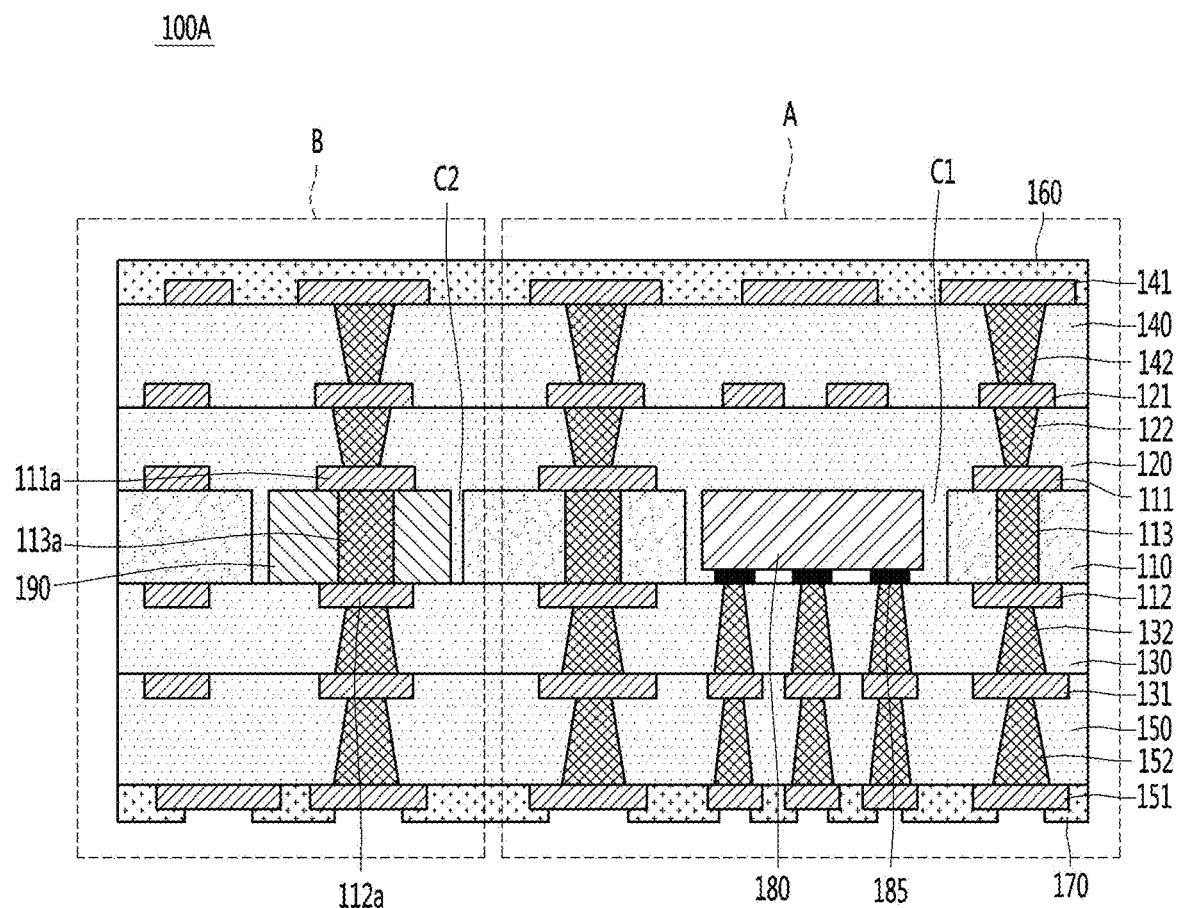
FIG. 11 is a cross-sectional view showing a printed circuit board according to a second embodiment.

FIG. 11 is a cross-sectional view showing a printed circuit board according to a second embodiment.

Referring to FIG. 11, the printed circuit board 100A includes a first insulating layer 110, a first cavity C1 and a second cavity C2 formed in the first insulating layer 100, a first circuit pattern 111 disposed on an upper surface of the first insulating layer 110, a second circuit pattern 112 disposed on a lower surface of the first insulating layer 110, a first via 113 formed to penetrate through the first insulating layer 110, a second insulating layer 120 disposed on the first insulating layer 110, a third circuit pattern 121 disposed on the second insulating layer 120, a second via 122 disposed to penetrate through the second insulating layer 120, a third insulating layer 130 disposed under the first insulating layer 110, a fourth circuit pattern 131 disposed under the third insulating layer 130, a third via 132 formed to penetrate through the third insulating layer 130, a fourth insulating layer 140 disposed on the second insulating layer 120, a fifth circuit pattern 141 disposed on the fourth insulating layer 140, a fourth via 142 formed to penetrate through the fourth insulating layer 140, a fifth insulating layer 150 formed under the third insulating layer 130, a sixth circuit pattern 151 disposed under the fifth insulating layer 150, a fifth via 152 formed to penetrate through the fifth insulating layer 150, a first protective layer 160 disposed on the fourth insulating layer 140, a second protective layer 170 disposed under the fifth insulating layer 150, a real die 180 inserted into the first cavity C1 and a dummy die 190 inserted into the second cavity C2.

At this time, the printed circuit board of FIG. 11 is different from the printed circuit board of FIG. 1 in that a circuit pattern is disposed on the dummy die 190 and a via penetrating through the dummy die 190 is further formed.

That is, in the printed circuit board of FIG. 1, the via is not provided in a region vertically overlapping the region in which the dummy die 190 is disposed.

At this time, as described above, when the via is not disposed in the region vertically overlapping the region in which the dummy die 190 is disposed, there may be a limitation in circuit design. Accordingly, in this embodiments, the via may be disposed even in the region vertically overlapping the dummy die 190.

To this end, the first circuit pattern 111 may include a (1-1)-th pattern 111a disposed on the upper surface of the dummy die 190. The (1-1)-th pattern 111a may be disposed to be directly in contact with the upper surface of the dummy die 190. In addition, the second circuit pattern 111 may include a (2-1)-th pattern 111a disposed on the lower surface of the dummy die 190. The (2-1)-th pattern 121a may be disposed to be directly in contact with the lower surface of the dummy die 190. In addition, a (1-1)-th via 113a may be disposed in the dummy die 190 to penetrate through the dummy die 190.

At this time, the dummy die 190 may be formed of a semiconductor material such as Si or GAAS other than the metal material, a ceramic material such as glass or an organic/inorganic composite material, for formation of the (1-1)-th pattern, the (2-1)-th pattern and the (1-1)-th via.

Meanwhile, formation of the dummy die 190 of the embodiment is applicable to a printed circuit board strip.

In general, a chip on board (COB) type semiconductor package is manufactured by mounting a semiconductor chip on a PCB frame, electrically connecting the semiconductor chip to a predetermined circuit pattern formed on the PCB frame and performing molding with mold resin. Recently, this method is widely applied to IC cards. Here, the PCB frame is manufactured or a strip structure in which a plurality of PCB frames is formed is manufactured in order to improve throughput of a semiconductor package manufacturing process, which is generally referred to as a printed circuit board strip.

Figure 12:
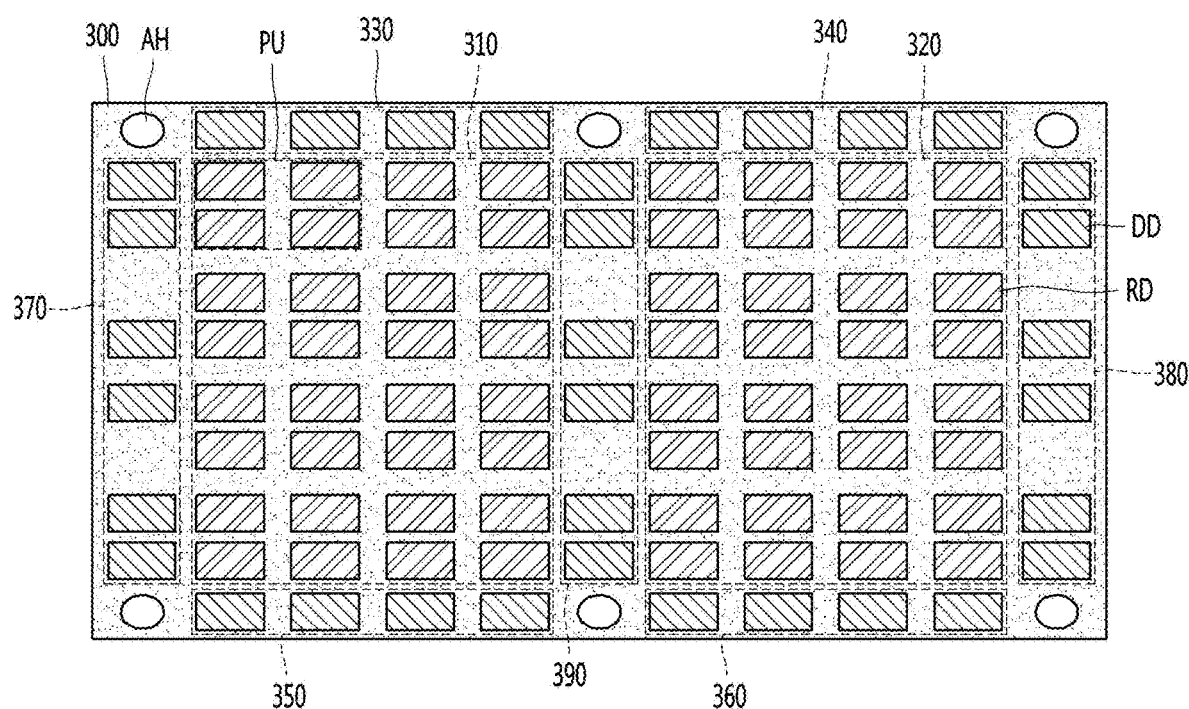
FIG. 12 is a plan view of a printed circuit board strip according to an embodiment.
Figure 13:
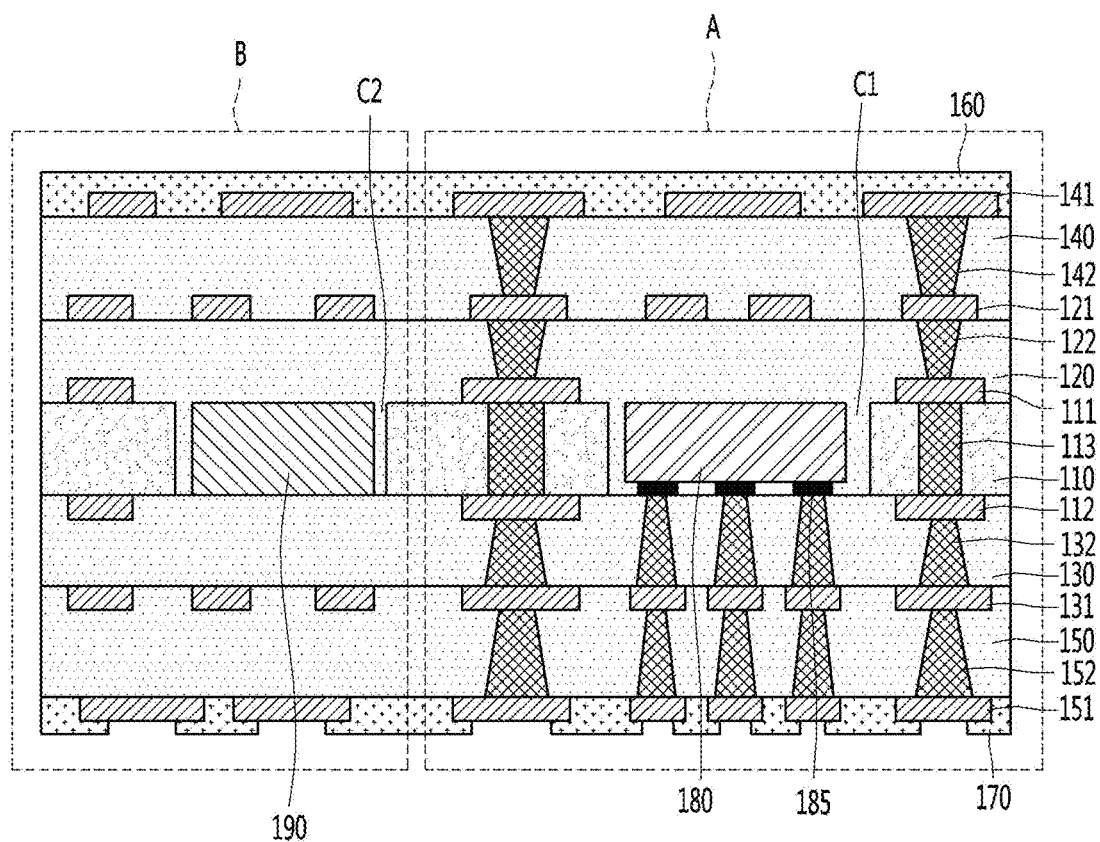
FIG. 13 is a cross-sectional view of the printed circuit board strip shown in FIG. 12.

FIG. 12 is a plan view of a printed circuit board strip according to an embodiment. FIG. 13 is a cross-sectional view of the printed circuit board strip shown in FIG. 12.

Referring to FIGS. 12 and 13, the printed circuit board strip 300 may include a frame region, in which a plurality of printed circuit board units PU is disposed, and a dummy region excluding the frame region.

At this time, the frame region may include a first frame region 310 in which the plurality of printed circuit board units PU is disposed and a second frame region 320 spaced apart from the first frame region 310 at a predetermined distance and including a plurality of printed circuit board units PU.

In addition, the printed circuit boards are disposed in the first frame region 310 and the second frame region 320. The printed circuit board may be equal to the printed circuit board shown in FIG. 1. However, preferably, the printed circuit boards disposed in the first and second frame regions may include the central region of the printed circuit board shown in FIG. 1, excluding the outer region in which the dummy die 190 is disposed.

Therefore, in the first and second frame regions, the plurality of printed circuit board units PU in which at least one real die 180 is embedded may be disposed.

The first frame region 310 and the second frame region 320 may be the central region of the upper surface of the printed circuit board strip 300.

In addition, a dummy region corresponding to the outer region of the upper surface of the printed circuit board strip 300 may be included around the first frame region 310 and the second frame region 320.

The dummy region may include a first outer region 330 disposed above the first frame region 310, a second outer region 340 disposed above the second frame region 320, a third outer region 350 disposed under the first frame region 310, a fourth outer region 360 disposed under the second frame region 320, a fifth outer region 370 disposed at the left side of the first frame region 310, and a sixth outer region 380 disposed at the right side of the second frame region 320. In addition, the dummy region may further include a region 390 between the first frame region 310 and the second frame region 320. At this time, the dummy region may be a ground region of the printed circuit board strip 300.

In addition, in the dummy region including the first to sixth outer regions, the above-described second cavity C2 and the dummy die 190 disposed in the second cavity are included.

At this time, the second cavity C2 may be formed to occupy 30% or more of the entire area of the dummy region excluding the first frame region 310 and the second frame region 320 in the printed circuit board strip 300. That is, when the printed circuit board strip 300 is manufactured, if only the first frame region 310 and the second frame region 320 including the printed circuit board units PU are included, a thickness difference of the second insulating layer in the dummy region occurs and thus a warping phenomenon in the dummy region occurs.

In the embodiment, the above-described problems may be solved by inserting the second cavity and the dummy die 190 into the dummy region of the printed circuit board strip 300.

Meanwhile, the plurality of outer regions configuring the dummy die 190 may include an outer region disposed in a long-axis direction of the printed circuit board strip 300 and an outer region disposed in a short-axis direction. At this time, the warping phenomenon mainly occurs in the long-axis direction. Therefore, in the embodiment, the opening ratio of the second cavity in the outer region disposed in the long-axis direction is greater than that of the second cavity in the outer region disposed in the short-axis direction.

In other words, the number of second cavities in the outer region disposed in the long-axis direction may be greater than the number of the second cavities in the outer region disposed in the short-axis direction. A gap between second cavities in the outer region disposed in the long-axis direction may be greater than a gap between the second cavities in the outer region disposed in the short-axis direction.

Meanwhile, in a corner region of the printed circuit board strip 300, an alignment hole AH for performing the inspection process and assembly process of the printed circuit board strip 300 may be formed.

In the related art, in the outer region of the printed circuit board strip 300, that is, the dummy region, the second cavity and the dummy die are not included. Therefore, in the related art, it can be seen that warpage of 7 mm occurs in the outer region.

However, according to the present embodiment, it can be seen that maximum warpage in the outer region is reduced to 1 mm, by forming the second cavity and the dummy die 190 in the outer region of the printed circuit board strip 300.

In the embodiment, when the component-embedded printed circuit board is manufactured, in an insulating layer in which a component is embedded, a cavity is formed even in a region in which the component is not included and a dummy die is inserted into the formed cavity. At this time, the dummy die does not include a real chip. That is, the dummy die may be formed of any one of a semiconductor material such as Si or GAAS, a ceramic material such as glass, a metal material such as copper or aluminum or an organic/inorganic composite material. In addition, the cavity occupies 30% or more of the region other than the region, in which the component is mounted, of the entire region of the insulating layer. According to the embodiment, in the component-embedded printed circuit board, it is possible to minimize a difference between the thicknesses of the upper insulating layer and the lower insulating layer based on the central insulating layer. In addition, according to the embodiment, it is possible to minimize a warping phenomenon occurring in the outer portion of the board by the dummy die having certain rigidity.

In addition, the above-described dummy is applicable to the printed circuit board strip. That is, a plurality of printed circuit board units having components embedded therein is disposed in the central region of the printed circuit board strip. In addition, the dummy die is inserted into the outer region corresponding to the ground region of the printed circuit board strip, along with the cavity. Therefore, it is possible to minimize a warping phenomenon occurring in the outer region of the printed circuit board strip and to improve reliability.

Features, structures, effects, and the like described in the above embodiments are included in at least one embodiment, and are not necessarily limited to only one embodiment. Further, the features, structures, effects, and the like illustrated in each embodiment may be combined or modified for other embodiments by a person having ordinary knowledge in the field, to which the embodiments belong. Therefore, content related to such combinations and modifications should be interpreted as being included in the scope of the embodiments. Although the embodiments have been disclosed for illustrative purposes, the embodiments are only exemplified, but do not limit the embodiments. Those skilled in the art will appreciate that various modifications and applications are possible, without departing from the embodiments. For example, the components described in the embodiments may be modified and embodied. Further, differences related to such modifications and applications should be interpreted as being included in the scope of the embodiments defined by the accompanying claims.

The invention claimed is:

1. A printed circuit board comprising:
   a first insulating layer including a plurality of first cavities formed in a first region and a plurality of second cavities formed in a second region corresponding to an outer region of the first region;
   a second insulating layer disposed on an upper surface of the first insulating layer;
   a third insulating layer disposed under a lower surface of the first insulating layer,
   a first via disposed to penetrate through the third insulating layer;
   a first die disposed in each of the plurality of first cavities; and
   a second die disposed in each of the plurality of second cavities,
   wherein the first die includes;
   a first body; and
   a driving device disposed on one surface of the first body and including a terminal directly electrically connected to the first via, and
   wherein the second die includes a second body and does not include a terminal and a driving device.

2. The printed circuit board of claim 1, wherein an entire area of the plurality of second cavities is at least 30% of an entire area of the second region of the first insulating layer.

3. The printed circuit board of claim 1, wherein the second body of the second die is formed of any one of a semiconductor material, a ceramic material, a metal material or an organic/inorganic composite material.

4. The printed circuit board of claim 1, wherein a height of the second body of the second die is equal to that of the first body of the first die.

5. The printed circuit board of claim 1, wherein a height of an upper surface of the second body of the second die is equal to that of the upper surface of the first insulating layer.

6. The printed circuit board of claim 1,
wherein an upper surface of the second body of the second die is directly in contact with a lower surface of the second insulating layer, and
wherein a lower surface of the second body of the second die is directly in contact with an upper surface of the third insulating layer.

7. The printed circuit board of claim 1, comprising:
a first circuit pattern disposed on the second die;
a second circuit pattern disposed under the second die; and
a via formed to penetrate through the second die.

8. The printed circuit board of claim 1,
wherein the second cavities include:
(2-1)-th cavities disposed in a long-axis direction of the first insulating layer; and
(2-2)-th cavities disposed in a short-axis direction of the first insulating layer, and
wherein a gap between the (2-1)-th cavities is equal to a gap between the plurality of first cavities.

9. The printed circuit board of claim 8, wherein the gap between the (2-1)-th cavities is less than a gap between the (2-2)-th cavities.

10. A printed circuit board strip comprising:
a frame region located in a first region corresponding to a central region of the printed circuit board strip and including disposed therein a plurality of printed circuit board units in which at least one first die is embedded; and
a dummy region located in a second region corresponding to an outer region of the printed circuit board strip and including a dummy region in which a plurality of second dies is embedded,
wherein the first die includes:
a first body; and
a driving device disposed on one surface of the first body and including a terminal directly electrically connected to the first via, and
wherein the second die includes a second body and does not include a terminal and a driving device.

11. The printed circuit board strip of claim 10, wherein a plurality of cavities, into which the second die is inserted, is formed in the dummy region, and an entire area of the plurality of cavities occupies 30% or more of an entire area of the dummy region.

12. The printed circuit board strip of claim 10, wherein the dummy region is a ground region.

* * * * *